US012593616B2

(12) United States Patent
Liu et al.

(10) Patent No.:  US 12,593,616 B2
(45) Date of Patent:  Mar. 31, 2026

(54) HALL EFFECT DEVICES INTEGRATED WITH JUNCTION TRANSISTORS

(71) Applicant: GlobalFoundries Singapore Pte. Ltd., Singapore (SG)

(72) Inventors: Xinfu Liu, Singapore (SG); Wensheng Deng, Singapore (SG); Jason Kin Wei Wong, Singapore (SG); Qianqian Meng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 573 days.

(21) Appl. No.: 17/805,864

(22) Filed: Jun. 8, 2022

(65) Prior Publication Data

US 2023/0403949 A1    Dec. 14, 2023

(51) Int. Cl.
*H10N 52/00*        (2023.01)
(52) U.S. Cl.
CPC ................................. *H10N 52/101* (2023.02)
(58) Field of Classification Search
CPC ...... G01R 33/07; G01R 33/077; H10N 52/00; H10N 52/01; H10N 52/101; H10N 52/85
See application file for complete search history.

(56) References Cited

U.S. PATENT DOCUMENTS

| | | | |
|---|---|---|---|
| 3,448,353 A | 6/1969 | Gallagher et al. | |
| 5,572,058 A | 11/1996 | Biard | |
| 5,627,398 A * | 5/1997 | Zlebir | H10N 59/00 |
| | | | 257/E27.005 |
| 8,618,583 B2 | 12/2013 | Candra et al. | |
| 9,520,551 B2 | 12/2016 | Kolb et al. | |
| 9,741,925 B2 | 8/2017 | Eckinger et al. | |
| 10,050,082 B1 * | 8/2018 | Liu | H01L 21/762 |
| 11,047,930 B2 | 6/2021 | Sun et al. | |
| 2014/0070795 A1 * | 3/2014 | Kolb | G01R 33/075 |
| | | | 324/202 |
| 2017/0288131 A1 | 10/2017 | Sun et al. | |
| 2020/0292631 A1 * | 9/2020 | Sun | H10N 52/01 |

FOREIGN PATENT DOCUMENTS

EP            1977460 B1    10/2008

* cited by examiner

*Primary Examiner* — Latanya N Crawford Eason
(74) *Attorney, Agent, or Firm* — Francois Pagette

(57)        ABSTRACT

The disclosed subject matter relates generally to semiconductor devices. More particularly, the present disclosure relates to Hall effect devices integrated with junction transistors to achieve tunable parameters within the Hall effect devices. The present disclosure also relates to methods of forming the Hall effect devices.

20 Claims, 8 Drawing Sheets

HALL EFFECT DEVICES INTEGRATED WITH JUNCTION TRANSISTORS

FIELD OF THE INVENTION

The disclosed subject matter relates generally to semiconductor devices. More particularly, the present disclosure relates to Hall effect devices integrated with junction transistors to achieve tunable parameters within the Hall effect devices. The present disclosure also relates to methods of forming the Hall effect devices.

BACKGROUND

Hall effect sensors or devices, which are capable of measuring changes in a magnetic field, have a broad range of applications, including consumer electronics (CE), automotive, and security. To preserve optimal behavior of the Hall Effect sensors, high sensitivity and low temperature drift are amongst performance aspects that need to be achieved. In various applications, the Hall devices have different resistance, voltage sensitivity, and current sensitivity requirements to perform the desired sensing for the different applications. Optimization of the various conflicting parameters are difficult to achieve within the same device structure.

Conventional Hall effect sensors generate an output voltage, i.e., a Hall voltage. The Hall voltage may often be of a low value and may be difficult to detect using measuring instruments. Amplifiers may be needed to increase the value of the Hall voltage so that the signal can be detected or measured. However, the inclusion of amplifiers may increase the size of the Hall effect device or the integrated circuit chip.

With the industry's drive for higher density, higher performance devices and the implementation of nanometer-scale process nodes, there is a need to provide Hall effect sensors with highly tunable parameters within the same Hall device structure.

SUMMARY

In an aspect of the present disclosure, there is provided a Hall effect device including a well region in a substrate, a channel region in the substrate, the channel region is over and in direct contact with the well region, and a Hall active region in the substrate, the Hall active region is over and in direct contact with the channel region. The channel region is between the well region and the Hall active region. The well region has a first conductivity type. The Hall active region has the same conductivity type as the well region. The channel region has a second conductivity type, the second conductivity type is of an opposite conductivity type to the first conductivity type. The Hall effect device also includes a first contact region in the Hall active region, a second contact region in the Hall active region, a supply contact region in the channel region, a sensing contact region in the channel region, and a control contact region in the well region.

In another aspect of the present disclosure, there is provided a Hall effect device including a well region in a substrate, a channel region in the substrate, the channel region is over and in direct contact with the well region, and a Hall active region in the substrate, the Hall active region is over and in direct contact with the channel region. The channel region is between the well region and the Hall active region. The well region has a first conductivity type. The Hall active region has the same conductivity type as the well region. The channel region has a second conductivity type, the second conductivity type is of an opposite conductivity type to the first conductivity type. The Hall effect device also includes a first contact region in the Hall active region, a second contact region in the Hall active region, a supply contact region in the channel region, a sensing contact region in the channel region, a control contact region in the well region, and a third contact region in the Hall active region. The third contact region is laterally between the first contact region and the second contact region, and the third contact region is connected to the control contact region.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figures 1A, 1B:
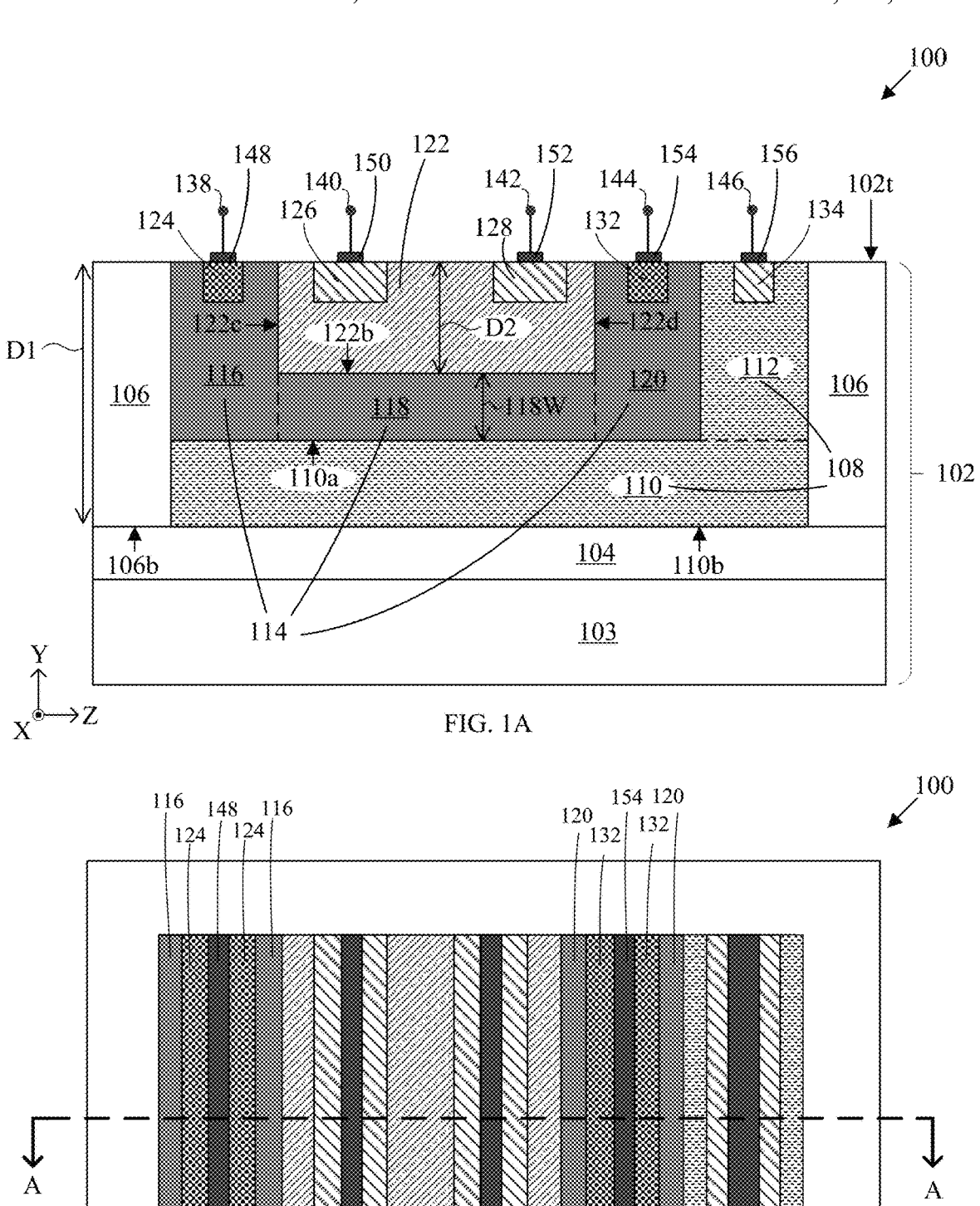
FIG. 1A is a cross-section view and FIG. 1B is a top down view of an exemplary Hall effect device.

FIG. 1A shows a cross sectional view of an example Hall effect device 100, while FIG. 1B shows a top-down view of the Hall effect device 100. Section line AA in FIG. 1B indicates the cross-section from which the view in FIG. 1A is taken from. The Hall effect device 100 may include a substrate 102. The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may have an amorphous, polycrystalline, or monocrystalline structure. In the example shown in FIG. 1A, the substrate 102 may include a buried insulator layer 104. The buried insulator layer 104 may include a dielectric material, such as an oxide (e.g., silicon dioxide, germanium dioxide, etc.) or a nitride (e.g., silicon nitride, germanium nitride, etc.). The buried insulator layer 104 may separate the substrate 102 into a bulk layer 103 and a semiconductor layer above the bulk layer 103, in which the buried insulator layer 104 is between the semiconductor layer and the bulk layer 103. In other examples (not shown), the substrate 102 may be a bulk substrate (i.e., the buried insulator layer 104 is not present). The substrate 102 may include various doped regions or doped wells. The substrate 102 may have an upper surface, in which the upper surface 102*t* of the substrate 102 may be used as a reference point to determine the depths of various doped regions or doped wells in the substrate 102.

A well region 108 may be formed in the substrate 102. In embodiments where the substrate 102 includes the buried insulator layer 104, the well region 108 may be positioned over and in direct contact with the buried insulator layer 104. The well region 108 may be doped to have a first conductivity type. For example, the well region 108 may have an N-type conductivity or a P-type conductivity. The substrate 102 may be lightly doped and may be of an opposite conductivity type to the well region 108. For example, if the well region 108 has an N-type conductivity, the substrate 102 may have a P-type conductivity. The substrate 102 may have a dopant concentration in the range of about 1E15 atoms/cm$^3$ to about 1E16 atoms/cm$^3$.

The well region 108 may have a vertical section 112 and a horizontal section 110. The vertical section 112 may be positioned over the horizontal section 110. In some embodiments, the vertical section 112 and the horizontal section 110 have different dopant concentrations. For example, the horizontal section 110 may have a lower dopant concentration than the vertical section 112. In other embodiments, the vertical section 112 and the horizontal section 110 have the same dopant concentration. In other words, the well region 108 may have a uniform dopant concentration. The vertical section 112 of the well region 108 may have an upper surface, in which the upper surface of the vertical section 112 of the well region 108 may be substantially coplanar with the upper surface 102*t* of the substrate 102.

A control contact region 134 may be formed in the well region 108. For example, the control contact region 134 may be in the vertical section 112 of the well region 108. The control contact region 134 may have an upper surface that is substantially coplanar with the upper surface of the vertical section 112 of the well region 108. The control contact region 134 may have the same conductivity type as the well region 108. The control contact region 134 may be doped to have a higher dopant concentration than the vertical section 112 of the well region 108. As an illustrative example, the horizontal section 110 of the well region 108 may have a dopant concentration in the range of about 1E16 atoms/cm$^3$ to about 1E17 atoms/cm$^3$. The vertical section 112 of the well region 108 may have a dopant concentration in the range of about 1E18 atoms/cm$^3$ to about 1E19 atoms/cm$^3$. The control contact region 134 may have a dopant concentration in the range of about 1E20 atoms/cm$^3$ to about 1E21 atoms/cm$^3$.

A channel region 114 may be formed in the substrate 102. The channel region 114 may be positioned over and in direct contact with the well region 108. In some embodiments, the horizontal section 110 of the well region 108 may be below the channel region 114, and the vertical section 112 of the well region 108 may be laterally adjacent to the channel region 114. The channel region 114 may have a second conductivity type. The second conductivity type may be of an opposite conductivity type to the first conductivity type. For example, the channel region 114 may be of an opposite conductivity type to the well region 108. If the well region 108 has an N-type conductivity, then the channel region 114 may be of a P-type conductivity, or if the well region has a P-type conductivity, then the channel region 114 may be of an N-type conductivity. The channel region 114 may directly contact the well region 108 to provide an electrical junction, such as a PN junction, therebetween.

The channel region 114 may have a first vertical section 116, a second vertical section 120, and a horizontal section 118 laterally between the first vertical section 116 and the second vertical section 120. The first vertical section 116 of the channel region 114 may have an upper surface, and the second vertical section 120 of the channel region 114 may have an upper surface. The upper surface of the first vertical section 116 of the channel region 114 and the upper surface of the second vertical section 120 of the channel region 114 may be substantially coplanar with the upper surface 102*t* of the substrate 102. The first vertical section 116 of the channel region 114 may have the same dopant concentration as the second vertical section 120 of the channel region 114. In some embodiments, the horizontal section 118 of the channel region 114 may have a different dopant concentration than the first vertical section 116 of the channel region 114 and the second vertical section 120 of the channel region 114. For example, the horizontal section 118 of the channel region 114 may have a lower dopant concentration than the first vertical section 116 of the channel region 114 and the second vertical section 120 of the channel region 114. In other embodiments, the horizontal section 118 of the channel region 114, the first vertical section 116 of the channel region 114, and the second vertical section 120 of the channel region 114 may have the same dopant concentration. In other words, the channel region 114 may have a uniform dopant concentration.

A sensing contact region 124 and a supply contact region 132 may be formed in the channel region 114. For example, the sensing contact region 124 may be in the first vertical section 116 of the channel region 114 while the supply contact region 132 may be in the second vertical section 120 of the channel region 114. The sensing contact region 124 may have an upper surface that is substantially coplanar with the upper surface of the first vertical section 116 of the channel region 114. The supply contact region 132 may have an upper surface that is substantially coplanar with the upper surface of the second vertical section 120 of the channel region 114.

The sensing contact region 124 and the supply contact region 132 may have the same conductivity type as the channel region 114. The sensing contact region 124 may be doped to have a higher dopant concentration than the first vertical section 116 of the channel region 114. The supply contact region 132 may be doped to have a higher dopant concentration than the second vertical section 120 of the channel region 114. As an illustrative example, the horizontal section 118 of the channel region 114 may have a dopant concentration in the range of about 1E17 atoms/cm$^3$ to about 1E18 atoms/cm$^3$. The first vertical section 116 and the second vertical section 120 of the channel region 114 may each have a dopant concentration in the range of about 1E18 atoms/cm$^3$ to about 1E19 atoms/cm$^3$. The sensing contact region 124 and the supply contact region 132 may each have a dopant concentration in the range of about 1E20 atoms/cm$^3$ to about 1E21 atoms/cm$^3$.

A Hall active region 122 may be formed in the substrate 102. The Hall active region 122 may be positioned over and in direct contact with the channel region 114. The Hall active region 122 may have a first side 122*c*, a second side 122*d*, and a bottom 122*b*. The first side 122*c* may be positioned opposite to the second side 122*d*. The channel region 114 may surround the first side 122c, the second side 122d, and the bottom 122b of the Hall active region 122. In some embodiments, the first vertical section 116 of the channel region 114 may be laterally adjacent to the first side 122c of the Hall active region 122, and the second vertical section 120 of the channel region 114 may be laterally adjacent to the second side 122d of the Hall active region 122. The horizontal section 118 of the channel region 114 may be positioned below the Hall active region 122. In some embodiments, the horizontal section 118 of the channel region 114 may be positioned below the bottom 122b of the Hall active region 122 and positioned above the horizontal section 110 of the well region 108.

The Hall active region 122 may have the same conductivity type as the well region 108. In other words, the Hall active region 122 may be of an opposite conductivity type to the channel region 114. For example, if the channel region 114 has an N-type conductivity, then the Hall active region 122 may be of a P-type conductivity, or if the channel region 114 has a P-type conductivity, then the Hall active region 122 may be of an N-type conductivity. The Hall active region 122 may directly contact the channel region 114 to provide an electrical junction, such as a PN junction, therebetween. The Hall active region 122 may have an upper surface, in which the upper surface of the Hall active region 122 may be substantially coplanar with the upper surface 102t of the substrate 102.

A first contact region 126 and a second contact region 128 may be formed in the Hall active region 122. The first contact region 126 and the second contact region 128 may have respective upper surfaces that are substantially coplanar with the upper surface of the Hall active region 122. The first contact region 126 and the second contact region 128 may have the same conductivity as the Hall active region 122. The first contact region 126 and the second contact region 128 may be doped to have a higher dopant concentration than the Hall active region 122. As an illustrative example, the Hall active region 122 may have a dopant concentration in the range of about 1E16 atoms/cm$^3$ to about 1E17 atoms/cm$^3$. The first contact region 126 and the second contact region 128 may each have a dopant concentration in the range of about 1E20 atoms/cm$^3$ to about 1E21 atoms/cm$^3$.

In an embodiment, the Hall active region 122 may have the same dopant concentration as the horizontal section 110 of the well region 108. The horizontal section 118 of the channel region 114 may have a higher dopant concentration than the Hall active region 122 and the horizontal section 110 of the well region 108.

An isolation structure 106 may be formed in the substrate 102. As shown in FIG. 1B, the isolation structure 106 may laterally enclose the well region 108, the channel region 114, and the Hall active region 122. The isolation structure 106 may be referred to as a shallow trench isolation. The isolation structure 106 may isolate the well region 108, the channel region 114, and the Hall active region 122 from other device regions in the substrate 102. For example, the isolation structure may isolate the Hall effect device 100 from logic devices (not shown).

The isolation structure 106 may include a dielectric material, e.g., oxides such as silicon dioxide (SiO$_2$), tetraethyl orthosilicate (TEOS). As shown in FIG. 1A, the isolation structure 106 may have a bottom 106b with a first depth D1 relative to the upper surface 102t of the substrate 102. The bottom 122b of the Hall active region 122 may have a second depth D2 relative to the upper surface 102t of the substrate 102. The second depth D2 may be shallower than the first depth D1. The isolation structure 106 may have an upper surface, in which the upper surface of the isolation structure 106 may be substantially coplanar with the upper surface 102t of the substrate 102. In an embodiment, the upper surface of the first vertical section 116 of the channel region 114, the upper surface of the second vertical section 120 of the channel region 114, the upper surface of the Hall active region 122, the upper surface of the vertical section 112 of the well region 108, and the upper surface of the isolation structure 106 may be substantially coplanar with one another.

The horizontal section 110 of the well region 108 may have a bottom 110b. The bottom 110b of the horizontal section 110 of the well region 108 may be substantially coplanar with the bottom 106b of the isolation structure 106. The horizontal section 110 of the well region 108 may be in direct contact with the isolation structure 106. The first vertical section 116 of the channel region 114 may be laterally adjacent to and in direct contact with the isolation structure 106. The second vertical section 120 of the channel region 114 may be laterally adjacent to and in direct contact with the vertical section 112 of the well region 108.

The Hall effect device 100 may further include a first Hall terminal 140 connected to the first contact region 126, a second Hall terminal 142 connected to the second contact region 128, a supply terminal 144 connected to the supply contact region 132, a sensing terminal 138 connected to the sensing contact region 124, and a control terminal 146 connected to the control contact region 134. A silicide layer 148, 150, 152, 154, 156 may be formed on each of the contact regions 124, 126, 128, 132, 134, respectively. The silicide layers 148, 150, 152, 154, 156 may partially cover the upper surfaces of the respective contact regions 124, 126, 128, 132, 134. The connection between the terminals 138, 140, 142, 144, 146 and the respective contact regions 124, 126, 128, 132, 134 may include at least a contact structure (not shown) formed on each of the silicide layers 148, 150, 152, 154, 156. The silicide layers 148, 150, 152, 154, 156 may include a metal silicide material. Examples of the metal silicide material for the silicide layers 148, 150, 152, 154, 156 may include, but are not limited to, nickel silicide, nickel-platinum silicide, cobalt silicide, titanium silicide.

The first Hall terminal 140 may be grounded and the second Hall terminal 142 may be biased by a first voltage. The second Hall terminal 142 may be configured to flow a current through the Hall active region 122 between the first Hall terminal 140 and the second Hall terminal 142. For example, a current may flow from the second contact region 128 to the first contact region 126. The first Hall terminal 140 may be configured to sense a current. For example, the output current from the second contact region 128 may flow to the first Hall terminal 140. The first Hall terminal 140 may be connected to a current meter to sense, detect, or measure the output current at the first Hall terminal 140. The supply terminal 144 may be biased by a second voltage and the sensing terminal 138 may be grounded. The supply terminal 144 may be configured to flow a current through the channel region 114 between the supply terminal 144 and the sensing terminal 138. For example, a current may flow from the supply contact region 132 to the sensing contact region 124. The sensing terminal 138 may be configured to sense a current. For example, the output current from the sensing contact region 124 may flow to the sensing terminal 138. The sensing terminal 138 may be connected to a current meter to sense, detect, or measure the output current from the sensing terminal 138.

The second voltage may be of an opposite polarity to the first voltage. For example, the first voltage applied to the second Hall terminal 142 may be of a positive voltage while the second voltage applied to the supply terminal 144 may be of a negative voltage. Alternatively, the first voltage applied to the second Hall terminal 142 may be of a negative voltage while the second voltage applied to the supply terminal 144 may be of a positive voltage. The control terminal 146 may be biased by a third voltage. The third voltage applied to the control terminal 146 may be of the same polarity as the first voltage applied to the first Hall terminal 140. The application of the first voltage to the second Hall terminal 142 may provide a bias voltage applied to the second contact region 128 in the Hall active region 122. The application of the third voltage to the control terminal 146 may provide a bias voltage applied to the control contact region 134 in the well region 108.

A magnetic field may be applied to the substrate 102. The channel region 114 may be widened or narrowed in response to changes in the magnetic field. For example, a magnetic field may be applied to the substrate 102 in a direction parallel to the upper surface 102*t* of the substrate 102. The orientation of the Hall effect device 100 may be adjusted such that the magnetic field applied to the substrate 102 also forms an angle between 0 degree to 90 degrees with respect to the direction of the current flow between the first contact region 126 of the Hall active region 122 and the second contact region 128 of the Hall active region 122. The changes in the angle between the magnetic field and the electric field (i.e., direction of current flow) in the Hall active region 122 may cause electric charges (e.g., electrons or holes) to move either towards the upper surface of the Hall active region 122 or towards the electrical junction between the Hall active region 122 and the channel region 114 (e.g., the horizontal section 118 of the channel region 114). The movement of the electric charges may widen or narrow the depletion zone in the electrical junction between the Hall active region 122 and the channel region 114, which in turn causes the channel region 114 to be narrowed or widened. The magnitude of the current flowing through the channel region 114 may change (e.g., increase or decrease) due to the widening or narrowing of the channel region 114. Thus, the changes in the magnetic field may be sensed by detecting the changes in the output current at the sensing terminal 138.

The channel region 114 may also be widened or narrowed by controlling the bias voltage applied to the control contact region 134 in the well region 108 and the bias voltage applied to the second contact region 128 in the Hall active region 122. The electrical junction between the Hall active region 122 and the channel region 114 and the electrical junction between the channel region 114 and the well region 108 may each include a depletion zone. The respective depletion zones may be widened or narrowed by controlling the bias voltage applied to the second contact region 128 in the Hall active region 122 and the bias voltage applied to the control contact region 134 in the well region 108. The widening or narrowing of the depletion zone between the Hall active region 122 and the channel region 114, and the widening or narrowing of the depletion zone between the channel region 114 and the well region 108 may widen or narrow the channel region 114, thereby increasing or decreasing the magnitude of the current flowing through the channel region 114.

To achieve increased sensitivity of the Hall effect device 100 in detecting small changes in the magnetic field strength, the channel region 114 may be narrowed, e.g., by controlling the bias voltage applied to the control contact region 134 in the well region 108 and the bias voltage applied to the second contact region 128 in the Hall active region 122. With a narrower channel region 114, small changes in the magnetic field strength may cause large changes in the current flowing through the narrower channel region 114, and the Hall effect device 100 may be able to increase its sensitivity towards the smaller changes in the magnetic field by detecting the changes in the output current at the sensing terminal 138.

In some implementations, the horizontal section 118 of the channel region 114 may have a thickness 118W. The thickness 118W may be defined as the distance between the bottom 122*b* of the Hall active region 122 and a bottom 110*a* of the horizontal section of the well region 108. By controlling the bias voltage applied to the second contact region 128 in the Hall active region 122 and the bias voltage applied to the control contact region 134 in the well region 108, the depletion zone between the Hall active region 122 and the horizontal section 118 of the channel region 114, and the depletion zone between the horizontal section 118 of the channel region 114 and the horizontal section 110 of the well region 108 may be widened or narrowed. This may enable the thickness 118W of the horizontal section 118 of the channel region 114 to be adjustable (e.g., increased or decreased) based on the bias voltage applied to the second contact region 128 in the Hall active region 122 and the bias voltage applied to the control contact region 134 in the well region 108.

Figures 2A, 2B:
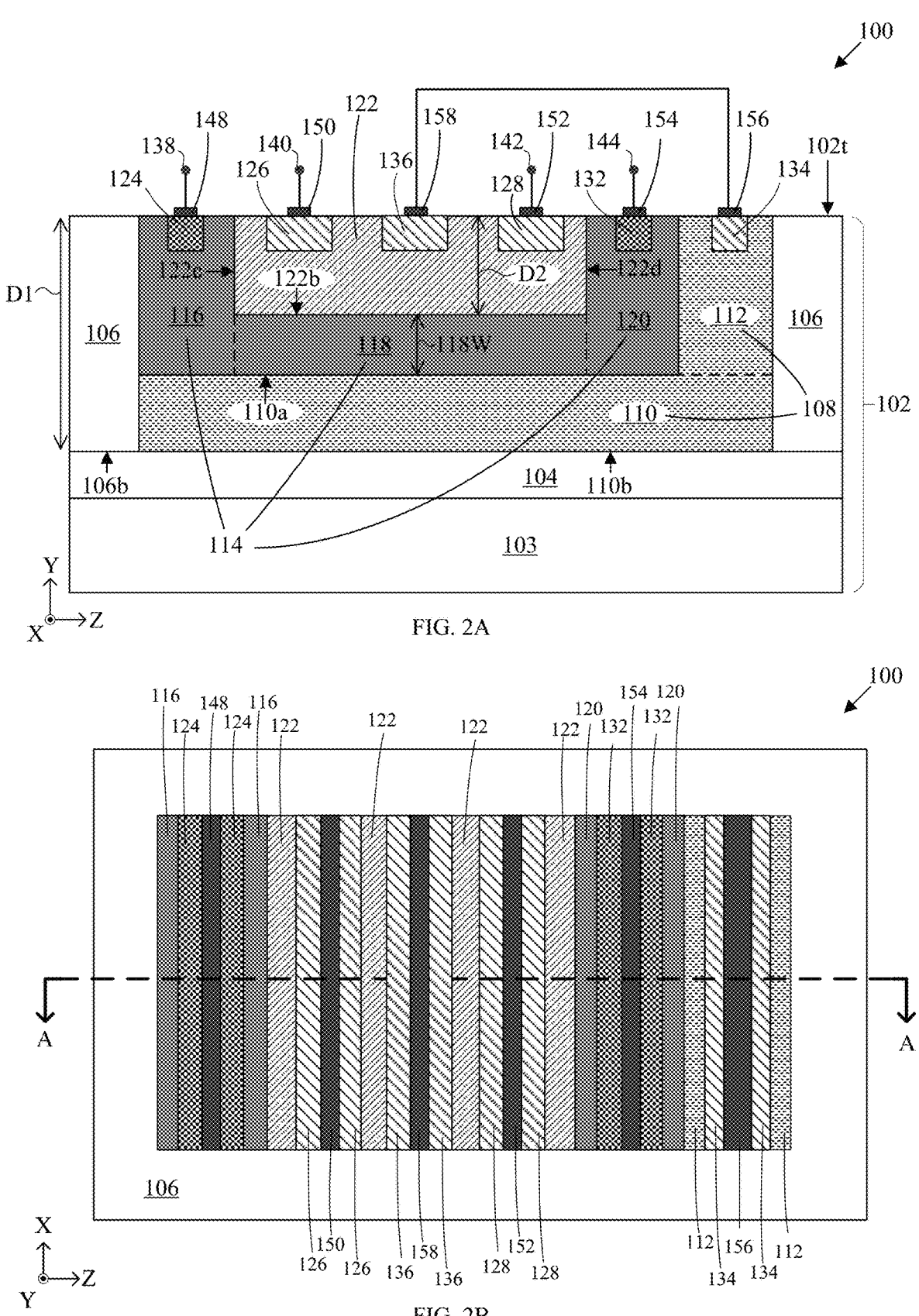
FIG. 2A is a cross-section view and FIG. 2B is a top down view of another exemplary Hall effect device.

FIG. 2A shows a cross sectional view of another example Hall effect device 100, while FIG. 2B shows a top-down view of the Hall effect device 100. Section line AA in FIG. 2B indicates the cross-section from which the view in FIG. 2A is taken from. Like reference numerals in FIG. 2A refer to like features in FIG. 1A and like reference numerals in FIG. 2B refer to like features in FIG. 1B. As shown in FIG. 2A and FIG. 2B, the Hall effect device 100 may include a third contact region 136 in the Hall active region 122. The third contact region 136 may be laterally between the first contact region 126 and the second contact region 128. The third contact region 136 in the Hall active region 122 may be connected to the control contact region 134 in the well region 108. By connecting the third contact region 136 to the control contact region 134, the well region 108 may be biased by the same voltage that is applied to the second contact region 128 in Hall active region 122. Thus, widening or narrowing of the channel region 114 may be controlled by one bias voltage, instead of two independent bias voltages as described in FIG. 1A and FIG. 1B.

As described herein, the first Hall terminal 140 may be grounded and the second Hall terminal 142 may be biased by a first voltage. The second Hall terminal 142 may be configured to flow a current through the Hall active region 122 between the first Hall terminal 140 and the second Hall terminal 142. Since electrical charges may move between the first contact region 126 and the second contact region 128, the positioning of the third contact region 136 between the first contact region 126 and the second contact region 128 may allow electrical charges to move into the third contact region 136.

FIGS. 3 through 6A show a set of steps that may be used to create the Hall effect device described herein.

Figures 3, 4:
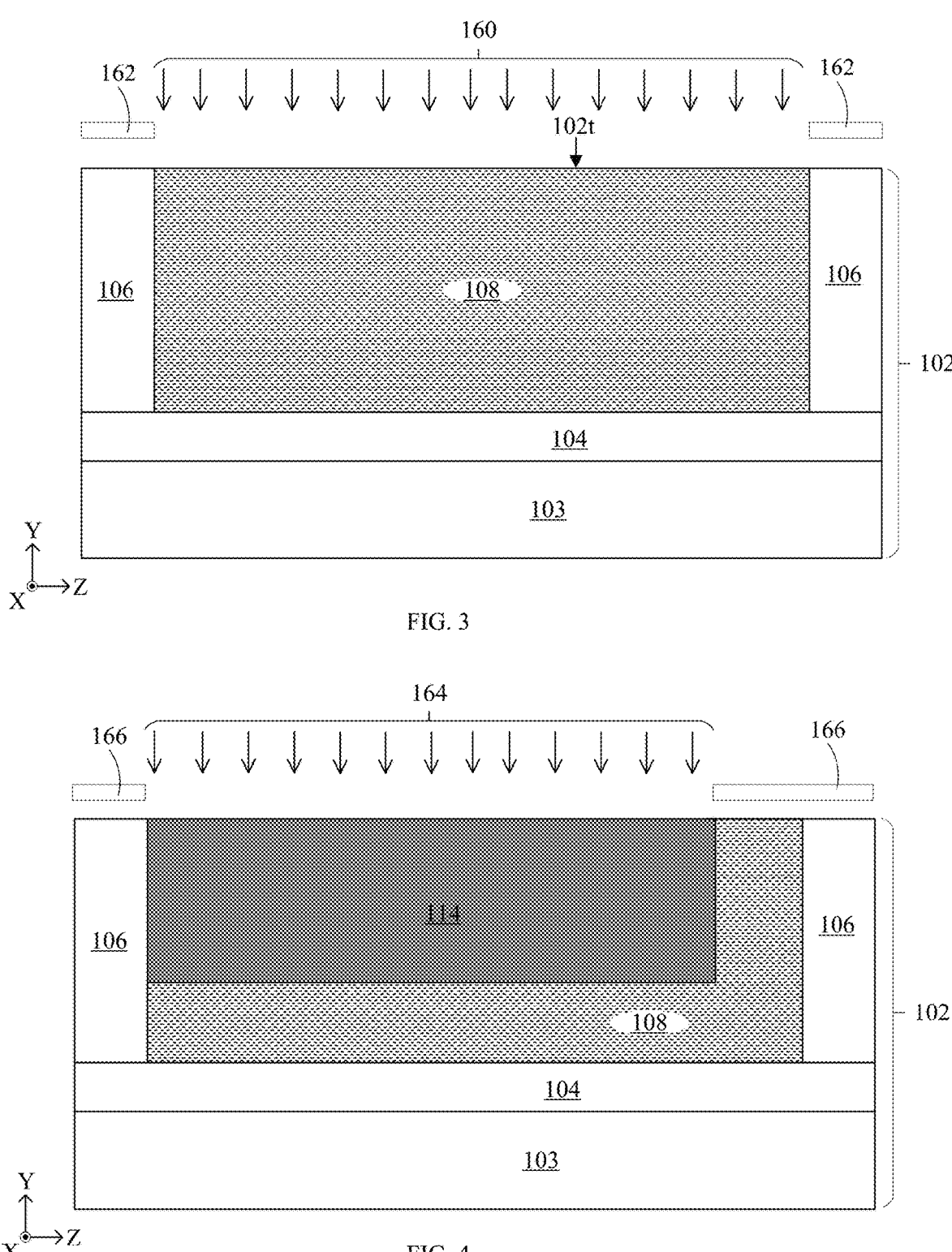
FIG. 3, FIG. 4, FIG. 5, FIG. 6A, and FIG. 6B are cross-sectional views depicting structures at various stages of a process of fabricating the exemplary Hall effect devices described herein.

Referring to FIG. 3, a structure for the fabrication of a Hall effect device may include a substrate 102. In some embodiments, the substrate 102 may be a semiconductor on insulator substrate and may include a buried insulator layer 104. In other embodiments (not shown), the substrate 102 may be a bulk substrate, in which the buried insulator layer 104 may be absent. An isolation structure 106 may be formed in the substrate 102. A well region 108 may be formed in the substrate 102. In embodiments where the substrate 102 includes a buried insulator layer 104, the well region 108 may be formed upon the buried insulator layer 104. The well region 108 may be laterally enclosed by the isolation structure 106. Formation of the well region 108 may include the use of an ion implantation process 160 to introduce dopants into the substrate 102. The dopants may be of an N-type conductivity or a P-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium. The doping of the substrate 102 to form the well region 108 may also include the use of an implant mask 162.

Referring to FIG. 4, a channel region 114 may be formed in the substrate 102. The channel region 114 may be formed over the well region 108. Formation of the channel region 114 may include the use of an ion implantation process 164 to introduce dopants of an opposite conductivity type, with respect to the well region 108, into the well region 108. An implant mask 166 may be used in the ion implantation process to define an area on the upper surface of the well region 108 for which dopants may be introduced while the remaining area on the upper surface of the well region 108 may be covered by the implant mask. For example, the well region 108 may have an N-type conductivity. Dopants of a P-type conductivity may be introduced into the well region 108. The concentration of the P-type dopants used in the ion implantation process 164 may be greater than the concentration of the N-type dopants in the well region 108 so that the resulting channel region 114 has a P-type conductivity. The depth of the implantation of the P-type dopants may be controlled such that the well region 108 has a horizontal section below the channel region 114 and a vertical section adjacent to the channel region 114.

Figure 5:
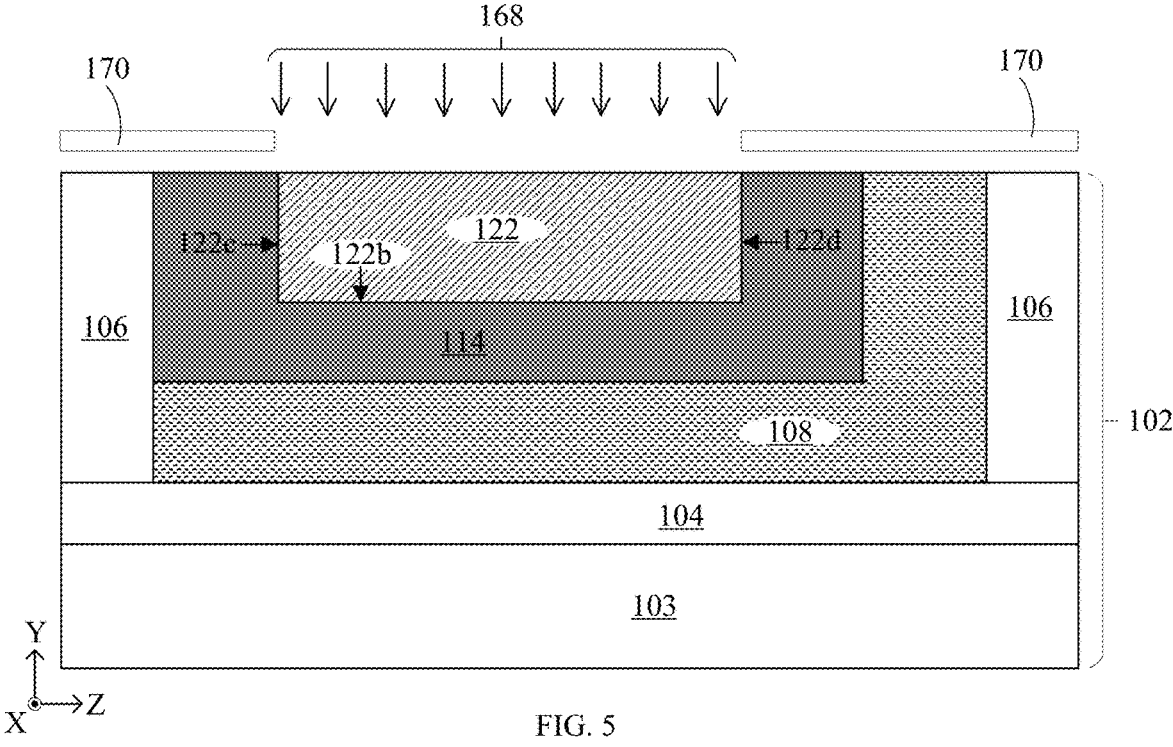

Referring to FIG. 5, a Hall active region 122 may be formed in the substrate 102. The Hall active region 122 may be formed over the channel region 114. Formation of the Hall active region 122 may include the use of an ion implantation process 168 to introduce dopants of an opposite conductivity type, with respect to the conductivity of the channel region 114, into the channel region 114. An implant mask 170 may be used in the ion implantation process 168 to define an area on the upper surface of the channel region 114 for which dopants may be introduced while the remaining area on the upper surface of the channel region 114 may be covered by the implant mask. For example, the channel region 114 may have a P-type conductivity. Dopants of an N-type conductivity may be introduced into the channel region 114. The concentration of the N-type dopants used in the ion implantation process 168 may be greater than the concentration of the P-type dopants in the channel region 114 so that the resulting Hall active region 122 has an N-type conductivity. The Hall active region 122 may be formed with a first side 122c, a second side 122d opposite to the first side 122c, and a bottom 122b. The depth of the implantation of the N-type dopants may be controlled such that the channel region 114 surrounds and is in direct contact with the first side 122c, the second side 122d, and the bottom 122b of the Hall active region 122.

Figure 6A:
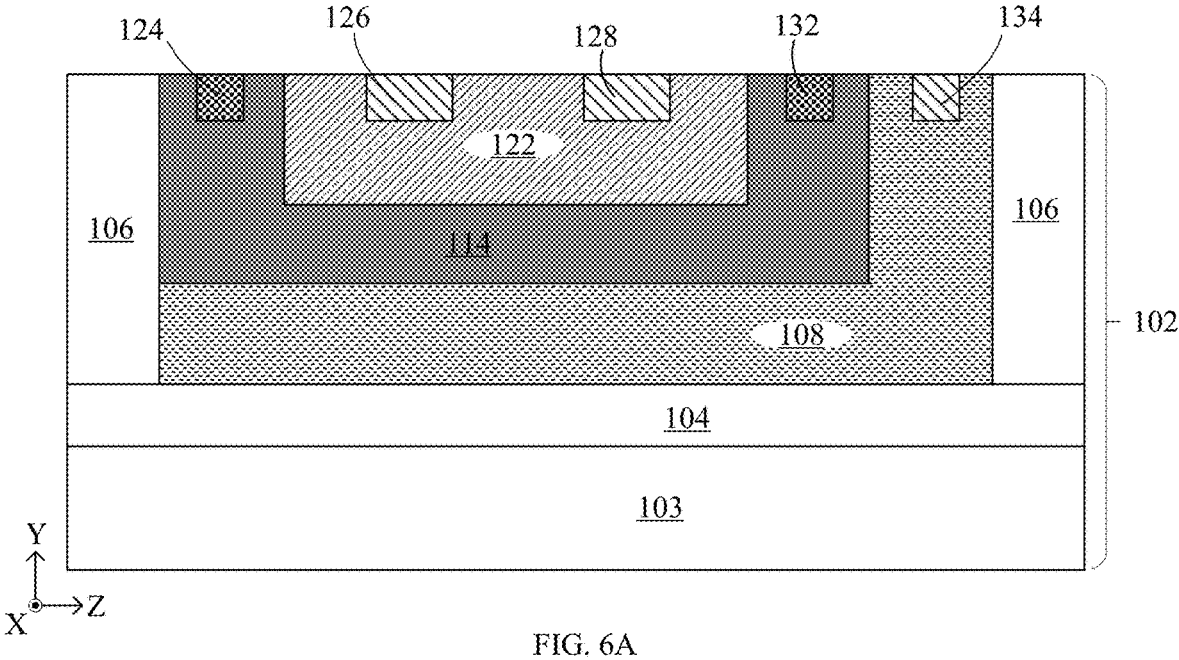

Referring to FIG. 6A (FIG. 6A continues from the structure shown in FIG. 5), a control contact region 134 may be formed in the well region 108. A first contact region 126 and a second contact region 128 may be formed in the Hall active region 122. Formation of the control contact region 134, the first contact region 126, and the second contact region 128 may be performed by an ion implantation process (not shown) with the use of an implant mask (not shown). For example, the upper surface of the well region 108 and the upper surface of the Hall active region 122 may be doped to introduce dopants of the same conductivity as the well region 108 and the Hall active region 122 but of a higher dopant concentration than the well region 108 and the Hall active region 122. A sensing contact region 124 and a supply contact region 132 may be formed in the channel region 114 by using another ion implantation process (not shown) with the use of another implant mask (not shown). For example, the upper surface of the channel region 114 may be doped to introduce dopants of the same conductivity as the channel region 114 but of a higher dopant concentration than the channel region 114.

Additional processing may be performed on the structure shown in FIG. 6A. For example, silicide layers may be formed on the control contact region 134, the sensing contact region 124, the supply contact region 132, the first contact region 126, and the second contact region 128. The silicide layers may be formed using a silicidation process. Contact structures may be formed on the silicide layers to provide connections for the control contact region 134, the sensing contact region 124, the supply contact region 132, the first contact region 126, and the second contact region 128 with various terminals. For example, the control contact region 134 may be connected to a control terminal 146, the sensing contact region 124 may be connected to a sensing terminal 138, the supply contact region 132 may be connected to a supply terminal 144, the first contact region 126 may be connected to a first Hall terminal 140, and the second contact region 128 may be connected to a second Hall terminal 142.

Figure 6B:
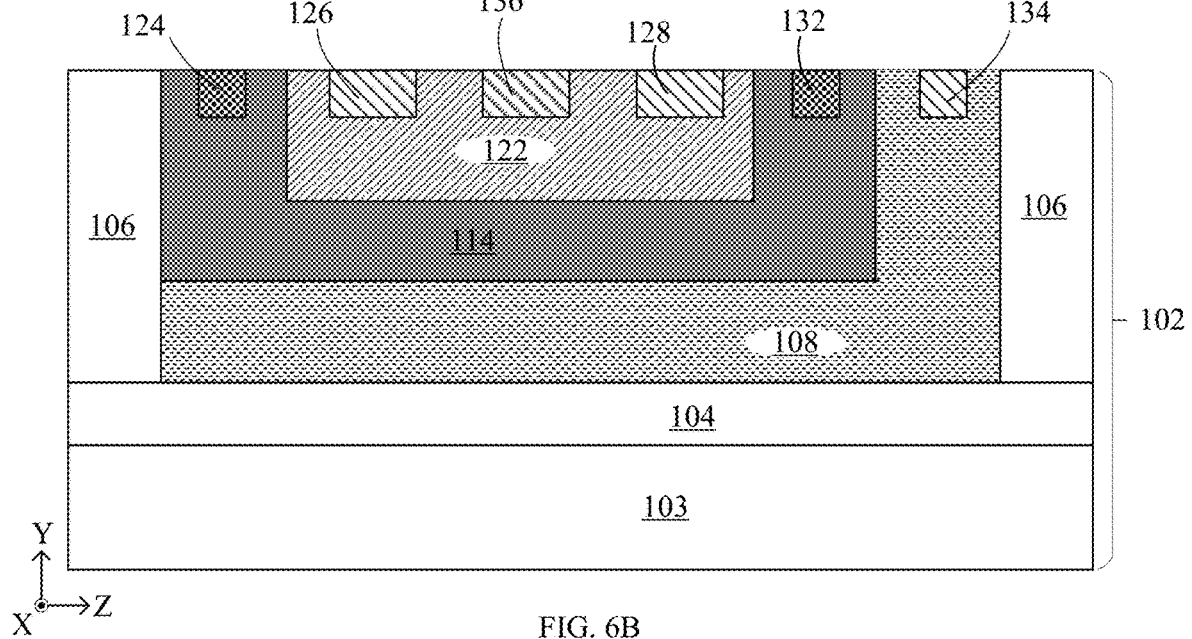

FIG. 6B illustrates an alternative structure formed at a processing stage subsequent to FIG. 5 which may be used to create the Hall effect device described herein. Referring to FIG. 6B (FIG. 6B continues from the structure shown in FIG. 5), a control contact region 134 may be formed in the well region 108. A first contact region 126, a second contact region 128, and a third contact region 136 may be formed in the Hall active region 122. The third contact region 136 may be formed laterally between the first contact region 126 and the second contact region 128. Formation of the control contact region 134, the first contact region 126, the second contact region 128, and the third contact region 136 may be performed by an ion implantation process (not shown) with the use of an implant mask (not shown). For example, the upper surface of the well region 108 and the upper surface of the Hall active region 122 may be doped to introduce dopants of the same conductivity as the well region 108 and the Hall active region 122 but of a higher dopant concentration than the well region 108 and the Hall active region 122. A sensing contact region 124 and a supply contact region 132 may be formed in the channel region 114 by using another ion implantation process (not shown) with the use of another implant mask (not shown). For example, the upper surface of the channel region 114 may be doped to introduce dopants of the same conductivity as the channel region 114 but of a higher dopant concentration than the channel region 114.

Additional processing may be performed on the structure shown in FIG. 6B. For example, silicide layers may be formed on the control contact region 134, the sensing contact region 124, the supply contact region 132, the first contact region 126, the second contact region 128, and the third contact region 136. The silicide layers may be formed using a silicidation process. Contact structures may be formed on the silicide layers to provide connections for the control contact region 134, the sensing contact region 124, the supply contact region 132, the first contact region 126, the second contact region 128, and the third contact region 136. For example, the sensing contact region 124 may be connected to a sensing terminal 138, the supply contact region 132 may be connected to a supply terminal 144, the first contact region 126 may be connected to a first Hall terminal 140, and the second contact region 128 may be connected to a second Hall terminal 142. The control contact region 134 may be connected to the third contact region 136.

FIGS. 7 through 10A show another set of steps that may be used to create the Hall effect device described herein.

Figure 7:
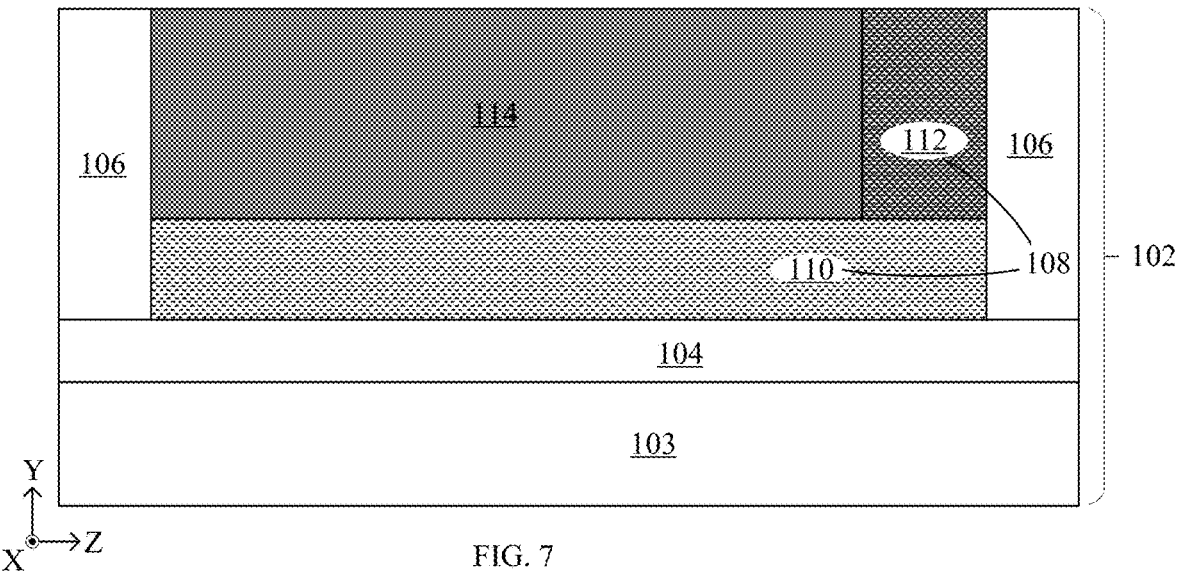
FIG. 7, FIG. 8, FIG. 9, FIG. 10A, and FIG. 10B are cross-sectional views depicting structures at various stages of another process of fabricating the exemplary Hall effect devices described herein.

Referring to FIG. 7, another structure for the fabrication of a Hall effect device may include a substrate 102. In some embodiments, the substrate 102 may be a semiconductor on insulator substrate and may include a buried insulator layer 104. In other embodiments (not shown), the substrate 102 may be a bulk substrate, in which the buried insulator layer 104 may be absent. An isolation structure 106 may be formed in the substrate 102. A well region 108 may be formed in the substrate 102. The well region 108 may be formed to have a horizontal section 110 and a vertical section 112 over the horizontal section 110. In embodiments where the substrate 102 includes a buried insulator layer 104, the horizontal section 110 of the well region 108 may be formed upon the buried insulator layer 104. The well region 108 may be laterally enclosed by the isolation structure 106. Formation of the well region 108 may include the use of more than one ion implantation process (not shown) to introduce dopants into the substrate 102. The dopants may be of an N-type conductivity or a P-type conductivity. For example, a first doping step may be performed to form the horizontal section 110 of the well region 108 and a second doping step may be performed to form the vertical section 112 of the well region 108. The vertical section 112 of the well region 108 may be doped with a higher dopant concentration than the horizontal section 110 of the well region 108. The vertical section 112 of the well region 108 may be doped with dopants of the same conductivity type as those in the horizontal section 110 of the well region 108.

A channel region 114 may be formed in the substrate 102. The channel region 114 may be formed such that the horizontal section 110 of the well region 108 is below the channel region 114 and the vertical section of the well region 108 is adjacent to the channel region 114. Formation of the channel region 114 may include the use of an ion implantation process (not shown) and an implant mask (not shown) to introduce dopants of an opposite conductivity type, with respect to the well region 108, into the substrate 102. For example, if the well region 108 has an N-type conductivity, then dopants of a P-type conductivity may be introduced into the substrate 102 to form the channel region 114.

Figure 8:
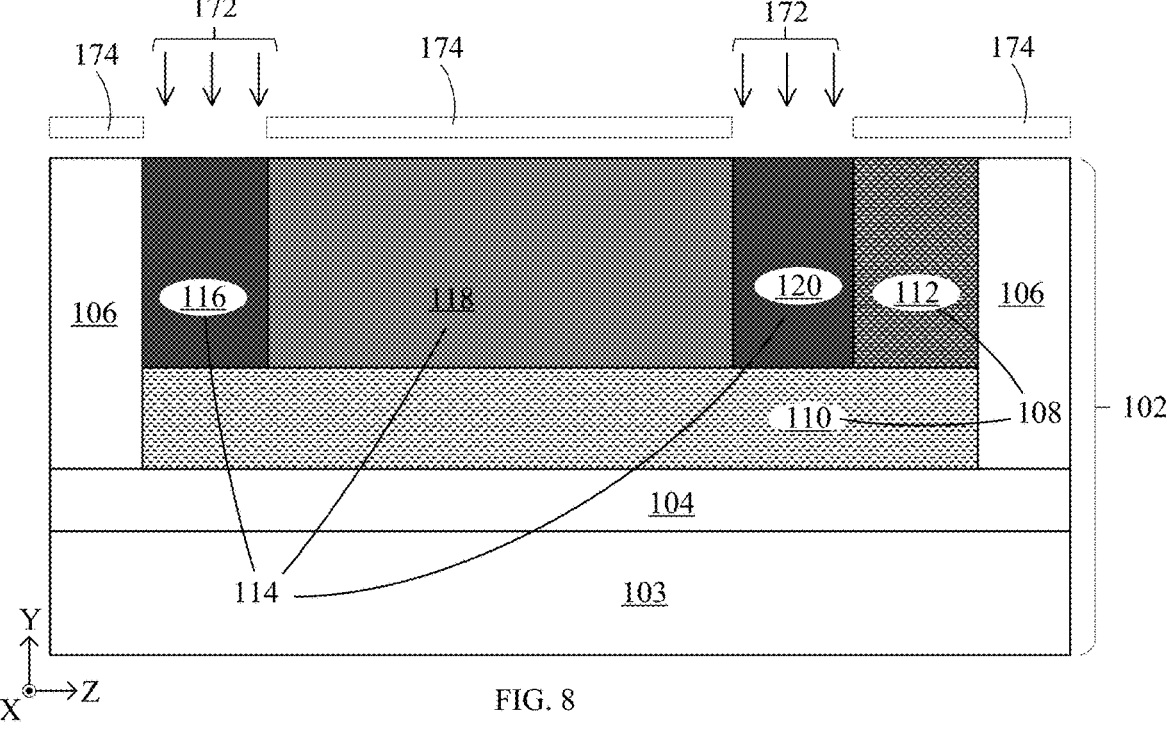

Referring to FIG. 8, the channel region 114 may be doped such that the channel region 114 has a first vertical section 116, a second vertical section 120, and a horizontal section 118 laterally between the first vertical section 116 and the second vertical section 120. The first vertical section 116 and the second vertical section 120 may be formed by doping the channel region 114 with dopants of the same conductivity but of a higher dopant concentration. For example, the channel region 114 may have a P-type conductivity. An ion implantation process 172 may be used to introduce dopants of a P-type conductivity and a higher dopant concentration into the upper surface of the channel region 114. An implant mask 174 may be used in the ion implantation process 172 to define an area on the upper surface of the channel region 114 for which the dopants may be introduced while the remaining area on the upper surface of the channel region 114 may be covered by the implant mask. The first vertical section 116 and the second vertical section 120 may have a higher dopant concentration than the horizontal section 118.

Figure 9:
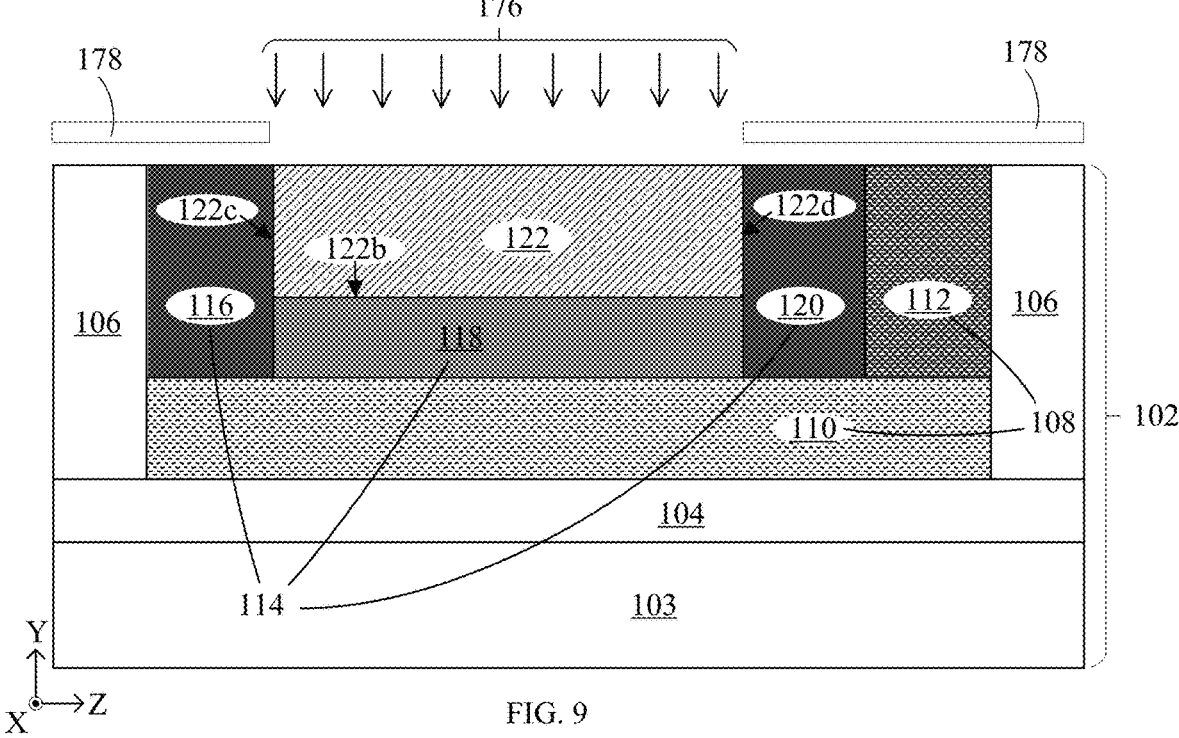

Referring to FIG. 9, a Hall active region 122 may be formed in the substrate 102. The Hall active region 122 may be formed over the channel region 114. Formation of the Hall active region 122 may include the use of an ion implantation process 176 to introduce dopants of an opposite conductivity type, with respect to the conductivity of the channel region 114, into the horizontal section 118 of the channel region 114. An implant mask 178 may be used in the ion implantation process 168 to cover the upper surfaces of the vertical sections 116, 120 while the upper surface of the horizontal section 118 is exposed, and the dopants of the opposite conductivity type may be introduced into the exposed upper surface of the horizontal section 118. For example, the horizontal section 118 of the channel region 114 may have a P-type conductivity. Dopants of an N-type conductivity may be introduced into the horizontal section 118 of the channel region 114. The concentration of the N-type dopants used in the ion implantation process 176 may be greater than the concentration of the P-type dopants in horizontal section 118 of the channel region 114 so that the resulting Hall active region 122 has an N-type conductivity. The Hall active region 122 may be formed with a first side 122c, a second side 122d opposite to the first side 122c, and a bottom 122b. The depth of the implantation of the N-type dopants may be controlled such that the horizontal section 118 of the channel region 114 is below and in direct contact with the bottom 122b of the Hall active region 122, the first vertical section 116 of the channel region 114 is adjacent to and in direct contact with the first side 122c, and the second vertical section 120 of the channel region 114 is adjacent to and in direct contact with the second side 122d.

Figure 10A:
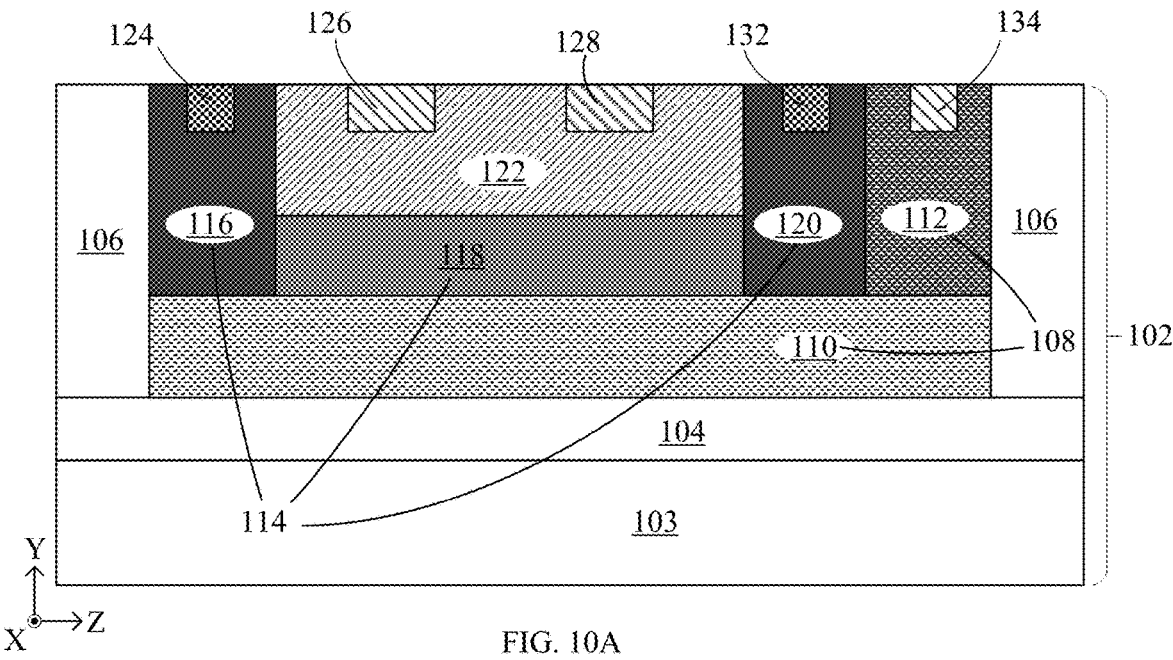

Referring to FIG. 10A (FIG. 10A continues from the structure shown in FIG. 9), a control contact region 134 may be formed in the vertical section 112 of the well region 108. A first contact region 126 and a second contact region 128 may be formed in the Hall active region 122. Formation of the control contact region 134, the first contact region 126, and the second contact region 128 may be performed by an ion implantation process (not shown) with the use of an implant mask (not shown). For example, the upper surface of the vertical section 112 of the well region 108 and the upper surface of the Hall active region 122 may be doped to introduce dopants of the same conductivity as the vertical section 112 of the well region 108 and the Hall active region 122 but of a higher dopant concentration than the vertical section 112 of the well region 108 and the Hall active region 122. A sensing contact region 124 may be formed in the first vertical section 116 of the channel region 114 and a supply contact region 132 may be formed in the second vertical section 120 of the channel region 114 by using another ion implantation process (not shown) with the use of another implant mask (not shown). For example, the respective upper surfaces of the vertical sections 116, 120 of the channel region 114 may be doped to introduce dopants of the same conductivity but of a higher dopant concentration than the vertical sections 116, 120 of the channel region 114.

Additional processing may be performed on the structure shown in FIG. 10A. For example, silicide layers may be formed on the control contact region 134, the sensing contact region 124, the supply contact region 132, the first contact region 126, and the second contact region 128. The silicide layers may be formed using a silicidation process. Contact structures may be formed on the silicide layers to provide connections for the control contact region 134, the sensing contact region 124, the supply contact region 132, the first contact region 126, and the second contact region 128 with various terminals. For example, the control contact region 134 may be connected to a control terminal 146, the sensing contact region 124 may be connected to a sensing terminal 138, the supply contact region 132 may be connected to a supply terminal 144, the first contact region 126 may be connected to a first Hall terminal 140, and the second contact region 128 may be connected to a second Hall terminal 142.

Figure 10B:
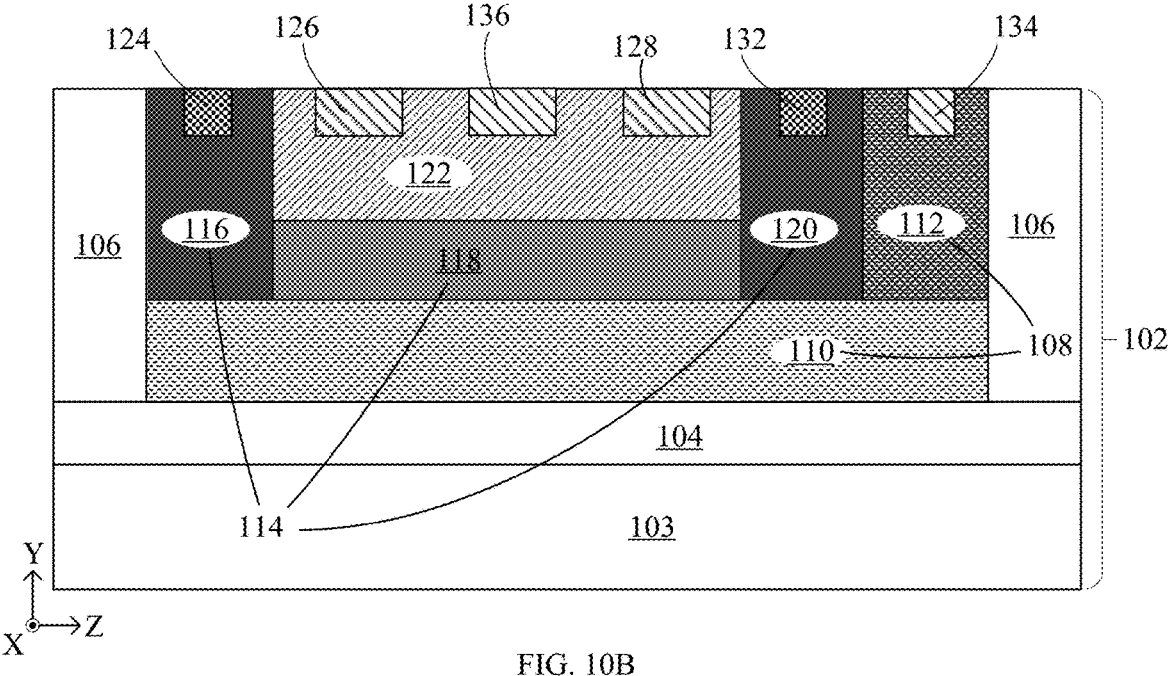

FIG. 10B illustrates an alternative structure formed at a processing stage subsequent to FIG. 9 which may be used to create the Hall effect device described herein. Referring to FIG. 10B (FIG. 10B continues from the structure shown in FIG. 9), a control contact region 134 may be formed in the vertical section 112 of the well region 108. A first contact region 126, a second contact region 128, and a third contact region 136 may be formed in the Hall active region 122. The third contact region 136 may be formed laterally between the first contact region 126 and the second contact region 128. Formation of the control contact region 134, the first contact region 126, the second contact region 128, and the third contact region 136 may be performed by an ion implantation process (not shown) with the use of an implant mask (not shown). For example, the upper surface of the vertical section 112 of the well region 108 and the upper surface of the Hall active region 122 may be doped to introduce dopants of the same conductivity as the vertical section 112 of the well region 108 and the Hall active region 122 but of a higher dopant concentration than the vertical section 112 of the well region 108 and the Hall active region 122. A sensing contact region 124 may be formed in the first vertical section 116 of the channel region 114 and a supply contact region 132 may be formed in the second vertical section 120 of the channel region 114 by using another ion implantation process (not shown) with the use of another implant mask (not shown). For example, the respective upper surfaces of the vertical sections 116, 120 of the channel region 114 may be doped to introduce dopants of the same conductivity but of a higher dopant concentration than the vertical sections 116, 120 of the channel region 114.

Additional processing may be performed on the structure shown in FIG. 10B. For example, silicide layers may be formed on the control contact region 134, the sensing contact region 124, the supply contact region 132, the first contact region 126, the second contact region 128, and the third contact region 136. The silicide layers may be formed using a silicidation process. Contact structures may be formed on the silicide layers to provide connections for the control contact region 134, the sensing contact region 124, the supply contact region 132, the first contact region 126, the second contact region 128, and the third contact region 136. For example, the sensing contact region 124 may be connected to a sensing terminal 138, the supply contact region 132 may be connected to a supply terminal 144, the first contact region 126 may be connected to a first Hall terminal 140, and the second contact region 128 may be connected to a second Hall terminal 142. The control contact region 134 may be connected to the third contact region 136.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, Hall sensors, FinFET transistor devices, CMOS devices, etc.

What is claimed is:

1. A Hall effect device comprising:

a well region in a substrate, the well region has a first conductivity type;

a channel region in the substrate, the channel region is over and in direct contact with the well region, the channel region has a second conductivity type, the second conductivity type is of an opposite conductivity type to the first conductivity type, the channel region includes a first vertical section, a second vertical section, and a horizontal section laterally between the first vertical section and the second vertical section, wherein the horizontal section of the channel region has a lower dopant concentration than the first vertical section of the channel region and the second vertical section of the channel region;

a Hall active region in the substrate, the Hall active region is over and in direct contact with the channel region, the Hall active region has the same conductivity type as the well region, wherein the channel region is between the well region and the Hall active region, and wherein the first vertical section of the channel region and the second vertical section of the channel region are in direct contact with the Hall active region; and an isolation structure laterally enclosing the well region, the channel region, and the Hall active region, wherein the first vertical section of the channel region is laterally adjacent to and in direct contact with the isolation structure.

2. The Hall effect device of claim 1, wherein the Hall active region has a first side, a second side positioned opposite to the first side, and a bottom, and wherein the channel region surrounds the first side, the second side, and the bottom of the Hall active region.

3. The Hall effect device of claim 2, wherein the isolation structure includes a dielectric material.

4. The Hall effect device of claim 3, wherein the substrate has an upper surface, the isolation structure has a bottom with a first depth relative to the upper surface of the substrate, the Hall active region has a bottom with a second depth relative to the upper surface of the substrate, and the second depth is shallower than the first depth.

5. The Hall effect device of claim 4, wherein the well region has a horizontal section and a vertical section over the horizontal section, the horizontal section of the well region is below the channel region, and the vertical section of the well region is laterally adjacent to the channel region.

6. The Hall effect device of claim 5, wherein the vertical section of the well region has an upper surface, and the upper surface of the vertical section of the well region is coplanar with the upper surface of the substrate.

7. The Hall effect device of claim 6, wherein the horizontal section of the channel region is below the Hall active region.

8. The Hall effect device of claim 7, wherein the second vertical section of the channel region is laterally adjacent to and in direct contact with the vertical section of the well region.

9. The Hall effect device of claim 8, wherein the first vertical section of the channel region has an upper surface, the second vertical section of the channel region has an upper surface, and the upper surface of the first vertical section of the channel region and the upper surface of the second vertical section of the channel region are coplanar with the upper surface of the substrate.

10. The Hall effect device of claim 9, wherein the horizontal section of the well region has a bottom, and the bottom of the horizontal section of the well region is coplanar with the bottom of the isolation structure.

11. The Hall effect device of claim 10, wherein the horizontal section of the well region is in direct contact with the isolation structure.

12. The Hall effect device of claim 1, further comprising:
a first contact region in the Hall active region;
a second contact region in the Hall active region;
a supply contact region in the channel region;
a sensing contact region in the channel region;
a control contact region in the well region;
a first Hall terminal connected to the first contact region, the first Hall terminal is grounded;
a second Hall terminal connected to the second contact region, the second Hall terminal biased by a first voltage;
a supply terminal connected to the supply contact region, the supply terminal is biased by a second voltage, the second voltage is of an opposite polarity to the first voltage;
a sensing terminal connected to the sensing contact region, the sensing terminal is grounded; and
a control terminal connected to the control contact region, the control terminal is biased by a third voltage, the third voltage is of the same polarity as the first voltage.

13. The Hall effect device of claim 12, wherein the supply terminal is configured to flow a current through the channel region between the supply terminal and the sensing terminal, and wherein the second Hall terminal is configured to flow a current through the Hall active region between the first Hall terminal and the second Hall terminal.

14. A Hall effect device comprising:
a well region in a substrate, the well region has a first conductivity type, the well region has a horizontal section and a vertical section over the horizontal section, wherein the horizontal section of the well region has a lower dopant concentration than the vertical section of the well region;
a channel region in the substrate, the channel region is over and in direct contact with the well region, the channel region includes a first vertical section, a second vertical section, and a horizontal section laterally between the first vertical section and the second vertical section, the channel region has a second conductivity type, the second conductivity type is of an opposite conductivity type to the first conductivity type, wherein the horizontal section of the well region is below the channel region, and the vertical section of the well region is laterally adjacent to the channel region;
a Hall active region in the substrate, the Hall active region is over and in direct contact with the channel region, the Hall active region has the same conductivity type as the well region, wherein the channel region is between the well region and the Hall active region; and
an isolation structure laterally enclosing the well region, the channel region, and the Hall active region, wherein the first vertical section of the channel region is laterally adjacent to and in direct contact with the isolation structure.

15. The Hall effect device of claim 14, wherein the horizontal section of the well region has the same dopant concentration as the Hall active region.

16. The Hall effect device of claim 5, wherein the horizontal section of the channel region has a higher dopant concentration than the Hall active region and the horizontal section of the well region.

17. The Hall effect device of claim 14, further comprising:
a first contact region in the Hall active region;
a second contact region in the Hall active region;
a supply contact region in the channel region;
a sensing contact region in the channel region; and
a control contact region in the well region.

18. A Hall effect device comprising:
a well region in a substrate, the well region has a first conductivity type and an upper surface;
a channel region in the substrate, the channel region is over and in direct contact with the well region, the channel region has a second conductivity type, the second conductivity type is of an opposite conductivity type to the first conductivity type;
a Hall active region in the substrate, the Hall active region is over and in direct contact with the channel region, the Hall active region has the same conductivity type as the well region, wherein the channel region is between the well region and the Hall active region;
a first contact region in the Hall active region;
a second contact region in the Hall active region;
a supply contact region in the channel region;
a sensing contact region in the channel region; and
a control contact region in the upper surface of the well region, the control contact region directly contacts the well region.

19. The Hall effect device of claim 18, wherein the control contact region has an upper surface that is substantially coplanar with an upper surface of the vertical section of the well region.

20. The Hall effect device of claim 18, further comprising:

a third contact region in the Hall active region, the third contact region is laterally between the first contact region and the second contact region, and the third contact region is connected to the control contact region.

\* \* \* \* \*